United States Patent [19]

Cho

[11] Patent Number: 5,161,121

[45] Date of Patent: Nov. 3, 1992

[54] RANDOM ACCESS MEMORY INCLUDING WORD LINE CLAMPING CIRCUITS

[75] Inventor: Shizuo Cho, Tokyo, Japan

[73] Assignee: OKI Electric Industry Co., Ltd., Tokyo, Japan

[21] Appl. No.: 711,325

[22] Filed: Jun. 6, 1991

Related U.S. Application Data

[63] Continuation of Ser. No. 367,023, Jun. 16, 1989, abandoned.

[30] Foreign Application Priority Data

Jun. 27, 1988 [JP] Japan ................... 63-158315

[51] Int. Cl.5 .............. G11C 7/02; G11C 11/408; G11C 11/415
[52] U.S. Cl. ................. 365/189.06; 365/230.06; 365/204
[58] Field of Search ............ 365/189.06, 230.06, 365/203, 204, 63, 72, 51

[56] References Cited

U.S. PATENT DOCUMENTS

| | | | |
|---|---|---|---|
| 4,264,828 | 4/1981 | Perlegos et al. | 365/230.06 |
| 4,275,312 | 6/1981 | Saita et al. | 365/230.06 |
| 4,467,225 | 8/1984 | Tanaka | 307/449 |
| 4,516,224 | 5/1985 | Aoyama | 365/204 |
| 4,791,613 | 12/1988 | Hardee | 365/189.09 |
| 4,868,788 | 9/1989 | Jinbo | 365/189.06 |
| 4,896,300 | 1/1990 | Shinagawa et al. | 365/204 |

FOREIGN PATENT DOCUMENTS

| | | | |
|---|---|---|---|
| 0117788 | 7/1984 | Japan | 365/230.06 |
| 0013395 | 1/1985 | Japan | 365/230.06 |
| 0171696 | 1/1985 | Japan | 365/230.06 |
| 0012996 | 1/1987 | Japan | 365/189.06 |

Primary Examiner—Glenn Gossage
Attorney, Agent, or Firm—Edward D. Manzo

[57] ABSTRACT

A dynamic random access memory comprising a matrix of memory cells accessed via word lines and bit lines also has clamp signal lines. The word lines terminate at switching elements, controlled by the clamp signal lines, through which the word lines are normally clamped to ground. In a memory access or refresh cycle, the selected word line is temporarily disconnected from ground by activating the corresponding clamp signal line. At the end of the cycle, the selected word line is again clamped to ground prior to precharging of the bit lines, in preparation for the next cycle. Non-selected word lines remain clamped to ground at all times, which prevents noise and improves data retention. Unnecessary current dissipation is avoided because switching elements are switched and word lines are unclamped only when necessary.

2 Claims, 3 Drawing Sheets

RANDOM ACCESS MEMORY INCLUDING WORD LINE CLAMPING CIRCUITS

This is a continuation of application Ser. No. 07/367,023, filed Jun. 16, 1989, now abandoned.

BACKGROUND OF THE INVENTION

This invention relates to a dynamic random access memory (hereinafter referred to as a dynamic RAM), more particularly to the word-line reset structure of such a dynamic RAM.

A dynamic RAM comprises a matrix of memory cells having storage capacitors and transfer gate transistors. The gate electrodes of the transfer gate transistors are connected to word lines running in the row direction of the matrix, their source electrodes are connected to bit lines running in the column direction, and their drain electrodes are connected to storage nodes. The storage nodes are in turn connected to the storage capacitors, in which bit data are stored as levels of charge. A memory cell is read by selecting its word line and sensing the voltage on its bit line, after which the memory cell is refreshed to restore the charge level in the storage capacitor. Even when data output is not required, the memory cell must be refreshed periodically to compensate for charge leakage.

After a memory cell is read or refreshed, its bit line must be precharged to a certain potential level to prepare for the next access or refresh cycle. All word lines must be clamped to the ground potential level at this time, so that the charging of the bit line will not produce unwanted activation of word lines via the parasitic capacitance between the word and bit lines.

A prior-art scheme for clamping the word lines provides terminating NMOS field-effect transistors, the source electrodes of which are connected to ground and the drain electrodes of which are connected to respective word lines. The gate electrodes of all these NMOS transistors are connected to a word reset signal line. During precharging of the bit lines, the word reset signal is active and all word lines are clamped to ground level. At other times the word reset signal is inactive and the word lines are disconnected from ground.

One problem of this scheme is that the circuit that generates the word reset signal must drive a large number of NMOS transistors, in addition to charging and discharging the parasitic capacitance of the word reset signal line. Another problem is that all the word lines are switched on and off in every memory cycle, requiring current to charge and discharge the parasitic capacitances of all the word lines. Owing to these two problems, a large charge-discharge current is consumed in each memory cycle, increasing the power dissipation of the dynamic RAM.

Yet another problem is that, except during precharging, both selected an non-selected word lines are disconnected from ground. This allows noise to occur on non-selected word lines, which tends to increase the escape of charge from memory cells and reduces the data retention margin.

SUMMARY OF THE INVENTION

An object of the present invention is accordingly to reduce power dissipation.

Another object of this invention is to prevent noise on non-selected word lines, thereby improving the data retention margin.

A dynamic RAM according to this invention comprises a row address decoder for receiving row address signal and generating a plurality of pairs of decode signals corresponding to different row addresses, a plurality of clamp signal lines for receiving one of each pair of decode signals, a plurality of word lines for receiving the other of each pair of decode signals, a plurality of switching elements for clamping respective word lines to ground when the decode signals on respective clamp signal lines are inactive and disconnecting respective word lines from ground when the decode signals on respective clamp signal lines are active, a plurality of bit lines corresponding to different column addresses, a matrix of memory cells connected to respective word lines and bit lines, a sense amplifier circuit for sensing the memory cells via the bit lines and generating amplified output signals, a column address decoder for receiving column address signals and decoding them to select one or more amplified output signals, and a precharge circuit for precharging the bit lines to a certain potential level.

DETAILED DESCRIPTION OF THE EMBODIMENTS

This invention provides a novel dynamic RAM for receiving row address and column address signal and writing, refreshing, and reading data into and out of memory cells addressed by these signals. The novel dynamic RAM will be described with particular attention to the read and refresh operations, and especially to its provisions for the clamping of word lines.

Figure 1:
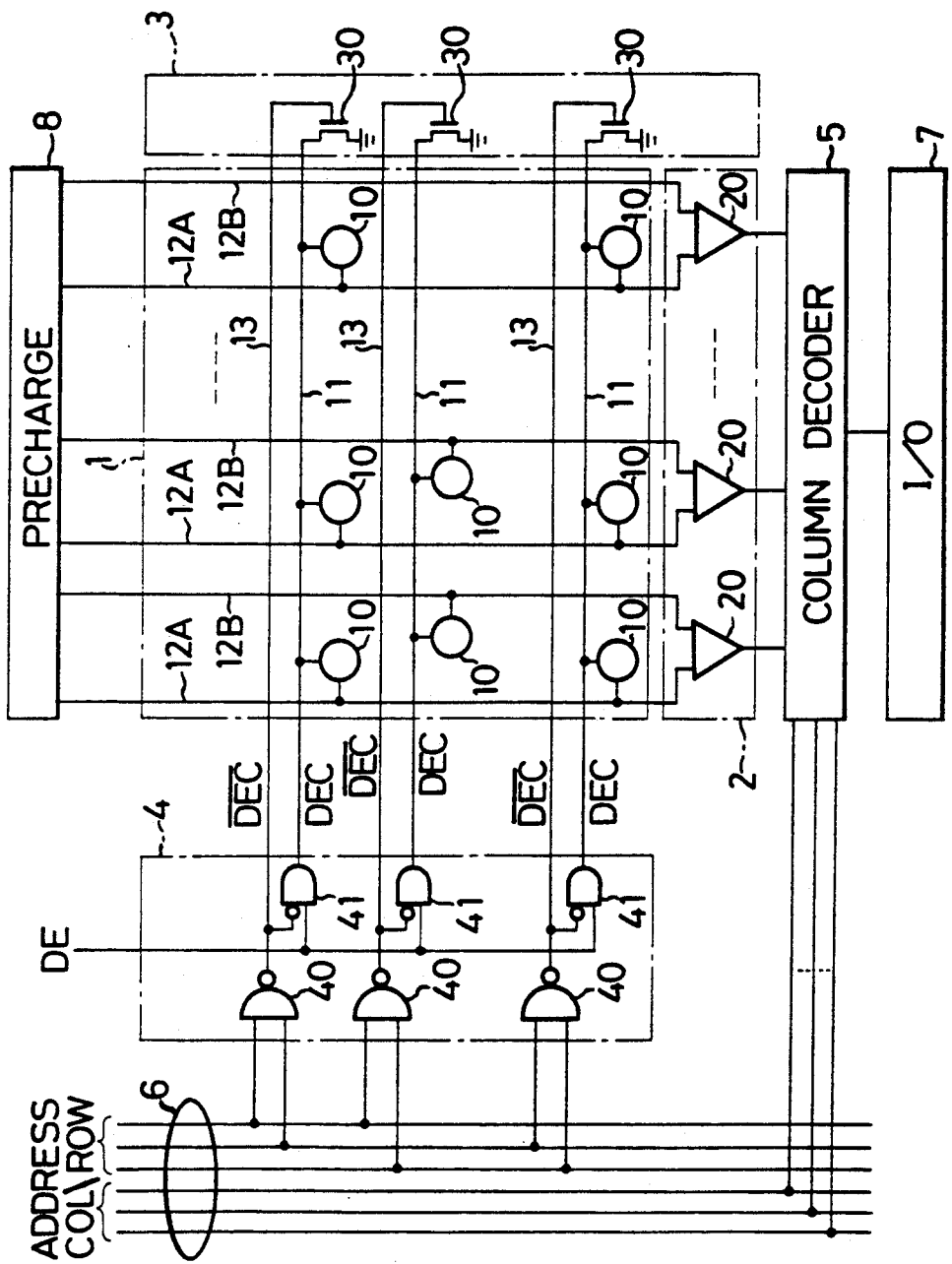
FIG. 1 is a schematic diagram of a dynamic RAM embodying this invention.

FIG. 1 is a schematic diagram of a novel dynamic RAM embodying this invention. Only the main component elements are shown. Signals and circuit details not relevant to the following description are omitted.

This dynamic RAM comprises a memory cell array 1 to which are connected a sense amplifier circuit 2, a word reset circuit 3, a row address decoder 4, and a column address decoder 5. The row address decoder 4 and the column address decoder 5 are connected to an address bus 6, from which they receive row and column address signals. The row address decoder generates pairs of decode signals denoted DEC and $\overline{\text{DEC}}$, each pair corresponding to a different row address. The column address decoder 5 is also connected to an input-output circuit 7, which is in turn connected to external signal lines such as an external data bus not shown in the drawing. The memory cell array 1 is connected to the word reset circuit 3, the row decoder 4, the column decoder 5, and a precharge circuit 8.

The memory cell array 1 comprises a plurality of memory cells 10 for storing data. The memory cells 10 are connected in a matrix arrangement to a plurality of word lines 11 and a plurality of bit lines 12A and 12B, each memory cell 10 being connected to a single word line and a single bit line. The word lines 11 are connected to the word reset circuit 3 and the row address decoder 4. The row address decoder 4 provides the word lines with the DEC signals, which activate the memory cells 10 when high. The bit lines 12A and 12B are connected to the sense amplifier circuit 2, which senses the resulting output of the memory cells 10, and to the precharge circuit 8, which precharges the bit lines to a certain potential level such as the supply voltage level $V_{CC}$.

The word reset circuit 3 and the row address decoder 4 are also interconnected by a plurality of clamp signal lines 13 which convey the $\overline{DEC}$ signals from the row address decoder 4 to the word reset circuit 3. The $\overline{DEC}$ signals on the clamp signal lines 13 correspond to the same row addresses as the DEC signals on the word lines 11, but whereas the DEC signals on the word lines 11 are active high, the $\overline{DEC}$ signals on the clamp signal lines 13 are active low.

Figure 2:
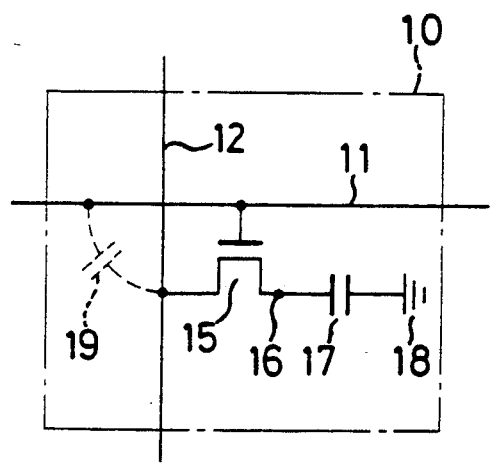
FIG. 2 is a schematic diagram of the memory cell circuit employed in FIG. 1.

FIG. 2 is a more detailed schematic diagram showing structure of a single memory cell 10. The memory cell 10 comprises an NMOS transfer gate transistor 15, a node 16, a memory cell capacitor 17, and a cell plate 18. The gate electrode of the transistor 15 is connected to a word line 11, while its source and drain electrodes are connected to a bit line 12 and to the node 16. The bit line 12 can be either a bit line 12A or a bit line 12B in FIG. 1. The node 16 is connected to the memory cell capacitor 17. The memory cell capacitor 17 is also connected to the cell plate 18, which is held at a fixed potential such as the ground potential $V_{SS}$, or one-half the supply voltage $V_{CC}$. A parasitic capacitance 19 indicated by the dashed lines exists between the bit line 12 and the word line 11.

Referring back to FIG. 1 the sense amplifier circuit 2 comprises a plurality of sense amplifiers 20 which are connected to pairs of bit lines 12A and 12B. Each sense amplifier 20 and each pair of bit lines 12A and 12B corresponds to a different column address. The function of a sense amplifier 20 is to sense the data stored in the memory cells 10 by detecting a slight voltage difference which may exist between the bit lines 12A and 12B and amplifying it to the magnitude of the difference between the supply voltage $V_{CC}$ and the ground potential $V_{SS}$, thus generating an amplified output signal. The sense amplifiers 20 can be structured as well-known flip-flop latch circuits.

The word reset circuit 3 comprises of plurality of switching elements such as NMOS clamping transistors 30, the gate electrodes of which are connected to respective clamp signal lines 13, and the source and drain electrodes of which are connected to respective word lines 11 and to ground. The function of an NMOS clamping transistor 30 is to connect its word line 11 to the ground potential when its clamp signal line 13 is in the inactive (high) state and disconnect its word line 11 from ground when its clamp signal line 11 is in the active (low) state.

The row address decoder 4 receives row address signals from the address bus 6, and a decode enable (DE) signal from a source not shown in the drawing. The purpose of the decode enable signal is to enable and disable the Decode signals supplied to the word lines 11. The decode enable signal may be generated from an external control signal such as a strobe signal. The row address signals are received by a plurality of NAND gates 40, which are connected to the address bus 6 in such a way that each combination of row address signals on the address bus 6 produces a low output signal from just one of the NAND gates 40. The output signals produced by the NAND gates 40 are provided to the clamp signal lines 13 as the $\overline{DEC}$ signals. The DE signal is received by a plurality of AND gates 41, which also receive the inverted output signals from respective NAND gates 40. The output signals generated by the AND gates 41 are supplied to the word lines 11 as the DEC signals. A DEC signal is therefore active (high) only when the corresponding $\overline{DEC}$ signal is active (low) and the DE signal is active (high).

The column address decoder 5 receives column address signals from the address bus 6 and decodes them to select the output of one or more sense amplifiers 20 in the sense amplifier circuit 2. The selected output becomes the output of the dynamic RAM.

Figure 3:
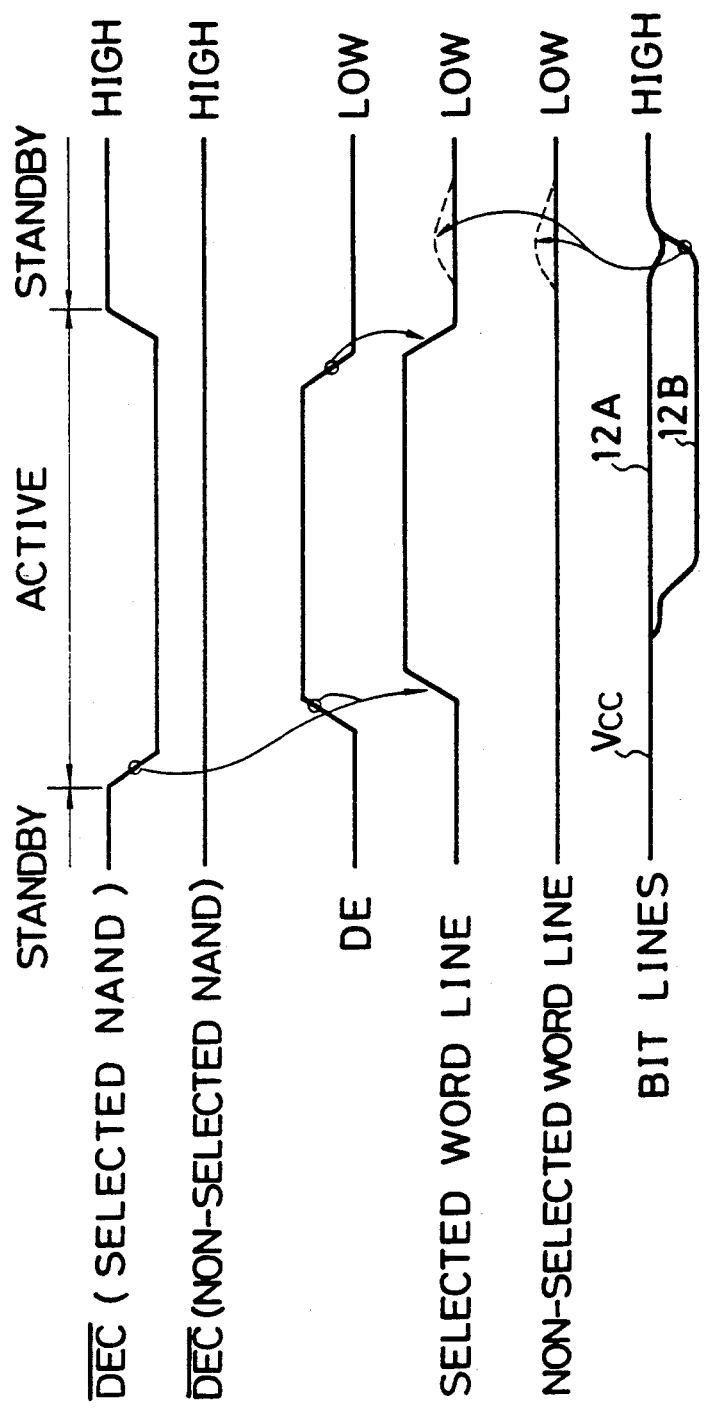
FIG. 3 is a timing chart illustrating the operation of the dynamic RAM in FIG. 1.

The operation of the novel dynamic RAM will be explained with reference to the timing chart in FIG. 3. The operations of reading and refreshing a memory cell will be described in detail, after which a brief description will be given of the operation of writing data in a memory cell.

The operation starts with the dynamic RAM in the standby state, in which all address lines ar low, all $\overline{DEC}$ signals are inactive (high), all NMOS clamping transistors 30 are in the on state, and all word lines 11 are clamped to ground level. The bit lines 12A and 12B are precharged to a certain potential (such as the supply voltage $V_{CC}$) by the precharge circuit 8. To read or refresh the data in a memory cell 10, the row and column addresses of that memory cell are set up on the address bus 6. The row address signals select one of the NAND gates 40 in the row address decoder 4, causing its $\overline{DEC}$ output to become active (low), at which point the connected NMOS clamping transistor 30 turns off, disconnecting the selected word line 11 from ground. The $\overline{DEC}$ signals of the non-selected NAND gates 40 remain high, their NMOS clamping transistors 30 remain in the on state, and their word lines 11 remain clamped to ground.

After the address has been set up on the address bus, the decode enable signal DE goes high, causing the output signal of the AND gate 41 connected to the selected NAND gate 40 to go high, thereby activating the word line 11 connected to this AND gate 41. The current path from the selected AND gate 41 to ground is now blocked by the NMOS clamping transistor 30. Since decoding is not normally enabled until an address has been set up, the decode enable signal does not become active until after the selected $\overline{DEC}$ signal goes low. This gives the NMOS clamping transistor 30 time to turn off before the selected AND gate 41 turns on, preventing unnecessary current flow from the AND gate 41 to ground.

When the selected word line 11 is activated, the transfer gate transistor 15 (shown in FIG. 2) on each of the memory cells of the corresponding row turns on, causing any charge stored in the memory cell capacitors 17 to be applied to either bit line 12A or 12B. If the charge is stored in a memory cell capacitor 17 of a memory cell 10, the result is a small potential difference between the pair of bit lines 12A and 12B in the column containing that memory cell 10 in FIG. 1. This small potential difference is amplified to the difference between $V_{CC}$ and $V_{SS}$ by the connected sense amplifier 20. The sense amplifiers 20 are designed so that the act of latching the data on the bit lines automatically places the amplified potential difference (if a potential difference is present) on the bit lines, thus refreshing the data stored in the memory cell 10. For a read operation, the column address decoder 5 also decodes the address on the address bus 6, selects one or more of the sense amplifiers 20, and supplies the output of the selected sense amplifier or amplifiers 20 to the input-output circuit 7.

After the the memory cell has been read or refreshed, to prepare for the next operation cycle, the decode enable signal DE goes low, disabling all the AND gates 41 and in particular the selected AND gate 41, so that the selected word line 11 goes low. Then the $\overline{\text{DEC}}$ output of the selected NAND gate 40 goes high, turning on the connected NMOS clamping transistor 30 and clamping the selected word line 11 to ground. Then the precharge circuit 8 charges the bit lines 12A and 12B to, for example, the supply voltage potential $V_{CC}$ and the dynamic RAM returns to the standby state.

The purpose of clamping the selected word line 11 to ground before precharging the bit lines 12A and 12B is to prevent the charging of the bit lines 12A and 12B from producing a temporary potential rise on the word line 11 through the parasitic capacitance 19 in FIG. 2, which might temporarily activate the word line 11 and cause charge to leak from the memory cell capacitor 17 to the bit lines 12A and 12B. The potential rise that would occur if the word lines were not clamped to ground is indicated by dashed lines in FIG. 3.

To write input data in a memory cell 10, its address is placed on the address bus 6, causing this cell to be selected by the row address decoder 4 and the column address decoder 5 as explained above, then an input circuit not shown in the drawings applies the input data to the bit lines 12A and 12B, causing it to be stored in the memory cell capacitor 17 of the selected memory cell 10.

One advantage of the novel dynamic RAM is that in a given memory access or refresh cycle, only the NMOS clamping transistor 30 connected to the selected word line 11 is switched off and on. It is therefore necessary to charge and discharge the capacitance of only a single word line and a single NMOS clamping transistor gate, so only a small amount of charge-discharge current is consumed per memory cycle.

Another advantage is that non-selected word lines 11 are clamped to ground through the NMOS clamping transistors 30 at all times, including both stanby and active times. This greatly improves the data retention margin during memory operation, because it prevents noise on non-selected word lines 11 from causing leakage of charge from the memory cells 10 to the bit lines 12A AND 12B.

Yet another advantage is that no separate circuit is needed to generate the signals that switch the NMOS clamping transistors 30 on and off. The circuit configuration of the novel dynamic RAM is accordingly simpler than in the prior art.

The scope of this invention is not limited to the structures shown in the drawings, but includes many variations and modifications that will be apparent to one skilled in the art. A few of these modifications will be briefly stated below.

As one modification, the transfer gate transistors 15 in FIG. 2 can be PMOS field-effect transistors instead of NMOS field-effect transistors, and instead of just one transistor there can be more, such as three or four.

As another modification, the NMOS clamping transistors 30 in the word reset circuit 3 can also be PMOS field-effect transistors, in which case they may be connected between the word lines 11 and the supply voltage $V_{CC}$ and clamp the word lines 11 to the supply voltage $V_{CC}$ according to the $\overline{\text{DEC}}$ outputs of the NAND gates 40. Furthermore, in place of NMOS or PMOS clamping transistors it is possible to use switching elements other than field-effect transistors.

As still another modification, the row address decoder 4 can have a gate configuration other than the structure of NAND gates 40 and AND gates 41 shown in the drawings.

What is claimed is:

1. A memory comprising:
   a plurality of word lines respectively extending in a word line direction, said word lines each having first and second separated end portions;
   a plurality of bit lines respectively extending in a bit line direction so as to intersect said word lines;
   a plurality of memory cells coupled to said word lines and bit lines so as to form a memory matrix;
   a plurality of clamp signal lines respectively extending in said word line direction;
   a decoder including a plurality of logic circuits, each located adjacent to a first end portion of a respective one of said word lines and generating a respective first signal, each one of said plurality of logic circuits having an inverting circuit to receive a corresponding first signal and to output a corresponding second signal having an inverted logic level opposite to a logic level of the corresponding first signal, each of said plurality of logic circuits applying its respective second signal to an adjacent first end portion of a corresponding one of said word lines and applying the corresponding first signal to a corresponding one of said clamp signal lines; and
   a plurality of switching elements, each coupled to a corresponding one of said plurality of logic circuits, each switching element having first, second and control electrodes, located adjacent and connected at the first electrode thereoof to the second end portion of a respective one of the word lines to whose first end portion the corresponding logic circuit is connected, receiving a corresponding first signal at the control electrode thereof through a corresponding clamp signal line connecting the adjacent second end portion of the respective one of the word lines to ground through the second electrode thereof upon the corresponding first signal being at a first logic level, and disconnecting the adjacent second end portion of the respective one of the word lines from ground by changing the corresponding first signal appearing at the control electrode thereof to a second logic level prior to the corresponding second signal changing to the first logic level.

2. A memory according to claim 1, wherein the switching elements are N-channel Metal Oxide Semiconductor field-effect transistors.

* * * * *